United States Patent
Kizilyalli et al.

(10) Patent No.: US 8,895,847 B2
(45) Date of Patent: Nov. 25, 2014

(54) PHOTOVOLTAIC DEVICE WITH INCREASED LIGHT TRAPPING

(75) Inventors: Isik C. Kizilyalli, San Francisco, CA (US); Melissa J. Archer, Mountain View, CA (US); Harry Atwater, South Pasadena, CA (US); Thomas J. Gmitter, Sunnyvale, CA (US); Gang He, Cupertino, CA (US); Andreas G. Hegedus, Burlingame, CA (US); Gregg Higashi, San Jose, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 258 days.

(21) Appl. No.: 12/940,966

(22) Filed: Nov. 5, 2010

(65) Prior Publication Data

US 2011/0048519 A1    Mar. 3, 2011

Related U.S. Application Data

(62) Division of application No. 12/605,140, filed on Oct. 23, 2009.

(60) Provisional application No. 61/107,962, filed on Oct. 23, 2008.

(51) Int. Cl.
*H01L 31/00* (2006.01)
*H01L 31/0735* (2012.01)
*H01L 31/0216* (2014.01)

(52) U.S. Cl.
CPC ...... *H01L 31/0735* (2013.01); *H01L 31/02168* (2013.01); *Y02E 10/544* (2013.01)
USPC ....................................... 136/262

(58) Field of Classification Search
USPC ......... 136/243, 244, 245, 246, 247, 248, 249, 136/250, 251, 252, 253, 254, 255, 256, 257, 136/258, 259, 260, 261, 262, 263, 264, 265
See application file for complete search history.

(56) References Cited

U.S. PATENT DOCUMENTS

| | | |
|---|---|---|
| 4,017,332 A | 4/1977 | James |
| 4,094,704 A | 6/1978 | Milnes |

(Continued)

FOREIGN PATENT DOCUMENTS

| | | |
|---|---|---|
| EP | 0595634 A1 | 5/1994 |
| JP | 06-244443 | 9/1994 |

(Continued)

OTHER PUBLICATIONS

Sanfacon et al "Analysis of Al/GaAs/GaAs Solar Cell Structures by Optical Reflectance Spectroscopy", IEEE Transactions on Electron Devices, vol. 37, Issue 2, pp. 450-454 (1990).*

(Continued)

*Primary Examiner* — Alexander Kollias
(74) *Attorney, Agent, or Firm* — Sawyer Law Group, P.C.

(57) ABSTRACT

Methods and apparatus are provided for converting electromagnetic radiation, such as solar energy, into electric energy with increased efficiency when compared to conventional solar cells. A photovoltaic (PV) device may incorporate front side and/or back side light trapping techniques in an effort to absorb as many of the photons incident on the front side of the PV device as possible in the absorber layer. The light trapping techniques may include a front side antireflective coating, multiple window layers, roughening or texturing on the front and/or the back sides, a back side diffuser for scattering the light, and/or a back side reflector for redirecting the light into the interior of the PV device. With such light trapping techniques, more light may be absorbed by the absorber layer for a given amount of incident light, thereby increasing the efficiency of the PV device.

11 Claims, 8 Drawing Sheets

(56) References Cited

U.S. PATENT DOCUMENTS

| | | | |
|---|---|---|---|
| 4,107,723 A | | 8/1978 | Kamath |
| 4,191,593 A | * | 3/1980 | Cacheux ............... 136/259 |
| 4,197,141 A | | 4/1980 | Bozler et al. |
| 4,295,002 A | | 10/1981 | Chappell et al. |
| 4,338,480 A | | 7/1982 | Antypas et al. |
| 4,385,198 A | * | 5/1983 | Rahilly ............... 136/249 |
| 4,400,221 A | | 8/1983 | Rahilly |
| 4,410,758 A | | 10/1983 | Grolitzer |
| 4,419,533 A | * | 12/1983 | Czubatyj et al. ........ 136/259 |
| 4,444,992 A | | 4/1984 | Cox, III |
| 4,479,027 A | | 10/1984 | Todorof |
| 4,497,974 A | * | 2/1985 | Deckman et al. ........ 136/259 |
| 4,633,030 A | | 12/1986 | Cook |
| 4,667,059 A | | 5/1987 | Olson |
| 4,889,656 A | | 12/1989 | Flynn et al. |
| 4,916,503 A | | 4/1990 | Uematsu et al. |
| 4,989,059 A | * | 1/1991 | Micheels et al. ......... 257/446 |
| 4,997,491 A | | 3/1991 | Hokuyo et al. |
| 5,116,427 A | | 5/1992 | Fan et al. |
| 5,217,539 A | | 6/1993 | Fraas et al. |
| 5,223,043 A | | 6/1993 | Olson et al. |
| 5,316,593 A | | 5/1994 | Olson et al. |
| 5,330,585 A | | 7/1994 | Chang et al. |
| 5,342,453 A | | 8/1994 | Olson |
| 5,376,185 A | | 12/1994 | Wanlass |
| 5,385,960 A | | 1/1995 | Emmons et al. |
| 6,107,563 A | | 8/2000 | Nakanishi et al. |
| 6,166,218 A | | 12/2000 | Ravichandran et al. |
| 6,166,318 A | | 12/2000 | Freeouf |
| 6,229,084 B1 | | 5/2001 | Katsu |
| 6,231,931 B1 | | 5/2001 | Blazey et al. |
| 6,255,580 B1 | * | 7/2001 | Karam et al. ........... 136/256 |
| 6,372,981 B1 | | 4/2002 | Ueda et al. |
| 6,617,508 B2 | | 9/2003 | Kilmer et al. |
| 2001/0027805 A1 | | 10/2001 | Ho et al. |
| 2002/0053683 A1 | | 5/2002 | Hill et al. |
| 2002/0144724 A1 | | 10/2002 | Kilmer et al. |
| 2002/0179141 A1 | | 12/2002 | Ho et al. |
| 2003/0070707 A1 | | 4/2003 | King et al. |
| 2003/0140962 A1 | | 7/2003 | Sharps et al. |
| 2003/0222278 A1 | | 12/2003 | Liu et al. |
| 2006/0081963 A1 | | 4/2006 | Rehder et al. |
| 2006/0144435 A1 | | 7/2006 | Wanlass |
| 2006/0162767 A1 | | 7/2006 | Mascarenhas et al. |
| 2006/0207651 A1 | | 9/2006 | Posthuma et al. |
| 2006/0255340 A1 | | 11/2006 | Manivannan et al. |
| 2007/0137695 A1 | | 6/2007 | Fetzer et al. |
| 2007/0137698 A1 | | 6/2007 | Wanlass et al. |
| 2007/0277874 A1 | | 12/2007 | Dawson-Elli et al. |
| 2008/0245409 A1 | | 10/2008 | Varghese et al. |
| 2009/0283802 A1 | | 11/2009 | Henderson et al. |
| 2010/0006143 A1 | | 1/2010 | Welser |
| 2010/0096010 A1 | | 4/2010 | Welser |
| 2010/0126552 A1 | | 5/2010 | Kizilyalli et al. |
| 2010/0126570 A1 | | 5/2010 | Kizilyalli et al. |
| 2010/0126571 A1 | | 5/2010 | Kizilyalli et al. |
| 2010/0126572 A1 | | 5/2010 | Kizilyalli et al. |
| 2010/0132774 A1 | | 6/2010 | Borden |
| 2010/0132780 A1 | | 6/2010 | Kizilyalli et al. |
| 2012/0031478 A1 | | 2/2012 | Boisvert et al. |

FOREIGN PATENT DOCUMENTS

| | | |
|---|---|---|
| JP | 07-007148 | 1/1995 |
| KR | 10-0762772 | 10/2007 |
| WO | WO 02065553 A1 | 8/2002 |

OTHER PUBLICATIONS

Peter A. Lewis, "Pigment Handbook vol. I: Properties and Economics, 2nd Edition", John Wiley & Sons, New York, pp. 790-791 (1988).

Q. M. Zhang et al., "Effects of Displaced p-n Junction of Heterojunction Bipolar Transistors", IEEE Transactions on Electron Devices, vol. 39, No. 11, Nov. 1992, pp. 2430-2437.

B. H. Floyd, et al., "AN N-AlGaAs P-GaAs Graded Heterojunction for High Concentration Ratios," pp. 81-86, IEEE, 1987.

* cited by examiner

US 8,895,847 B2

PHOTOVOLTAIC DEVICE WITH INCREASED LIGHT TRAPPING

CROSS-REFERENCE TO RELATED APPLICATIONS

Under 35 U.S.C. §120, this application is a divisional application and claims the benefit of priority to U.S. patent application Ser. No. 12/605,140, filed Oct. 23, 2009 and U.S. Provisional Patent Application Ser. No. 61/107,962, filed Oct. 23, 2008, all of which is incorporated herein by reference.

BACKGROUND

1. Technical Field

Embodiments of the present invention generally relate to photovoltaic (PV) devices, such as solar cells, with increased efficiency and greater flexibility and methods for fabricating the same.

2. Description of the Related Art

As fossil fuels are being depleted at ever-increasing rates, the need for alternative energy sources is becoming more and more apparent. Energy derived from wind, from the sun, and from flowing water offer renewable, environment-friendly alternatives to fossil fuels, such as coal, oil, and natural gas. Being readily available almost anywhere on Earth, solar energy may someday be a viable alternative.

To harness energy from the sun, the junction of a solar cell absorbs photons to produce electron-hole pairs, which are separated by the internal electric field of the junction to generate a voltage, thereby converting light energy to electric energy. The generated voltage can be increased by connecting solar cells in series, and the current may be increased by connecting solar cells in parallel. Solar cells may be grouped together on solar panels. An inverter may be coupled to several solar panels to convert DC power to AC power.

Nevertheless, the currently high cost of producing solar cells relative to the low efficiency levels of contemporary devices is preventing solar cells from becoming a mainstream energy source and limiting the applications to which solar cells may be suited. Accordingly, there is a need for more efficient photovoltaic devices suitable for a myriad of applications.

SUMMARY OF THE INVENTION

Embodiments of the present invention generally relate to methods and apparatus for converting electromagnetic radiation, such as solar energy, into electric energy with increased efficiency when compared to conventional solar cells.

One embodiment of the present invention provides a photovoltaic (PV) device. The PV device generally includes a $p^+$-doped layer, an n-doped layer disposed above the $p^+$-doped layer to form a p-n layer such that electric energy is created when photons are absorbed by the p-n layer, a window layer disposed above the n-doped layer, and an antireflective coating disposed above the window layer.

Another embodiment of the present invention provides a PV device. The PV device generally includes a $p^+$-doped layer, an n-doped layer disposed above the $p^+$-doped layer to form a p-n layer such that electric energy is created when light is absorbed by the p-n layer, a window layer disposed above the n-doped layer, and a diffuser disposed below the $p^+$-doped layer.

BRIEF DESCRIPTION OF THE DRAWINGS

So that the manner in which the above-recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide techniques and apparatus for converting electromagnetic radiation, such as solar energy, into electric energy with increased efficiency when compared to conventional solar cells.

An Exemplary Photovoltaic Unit

Figure 1:
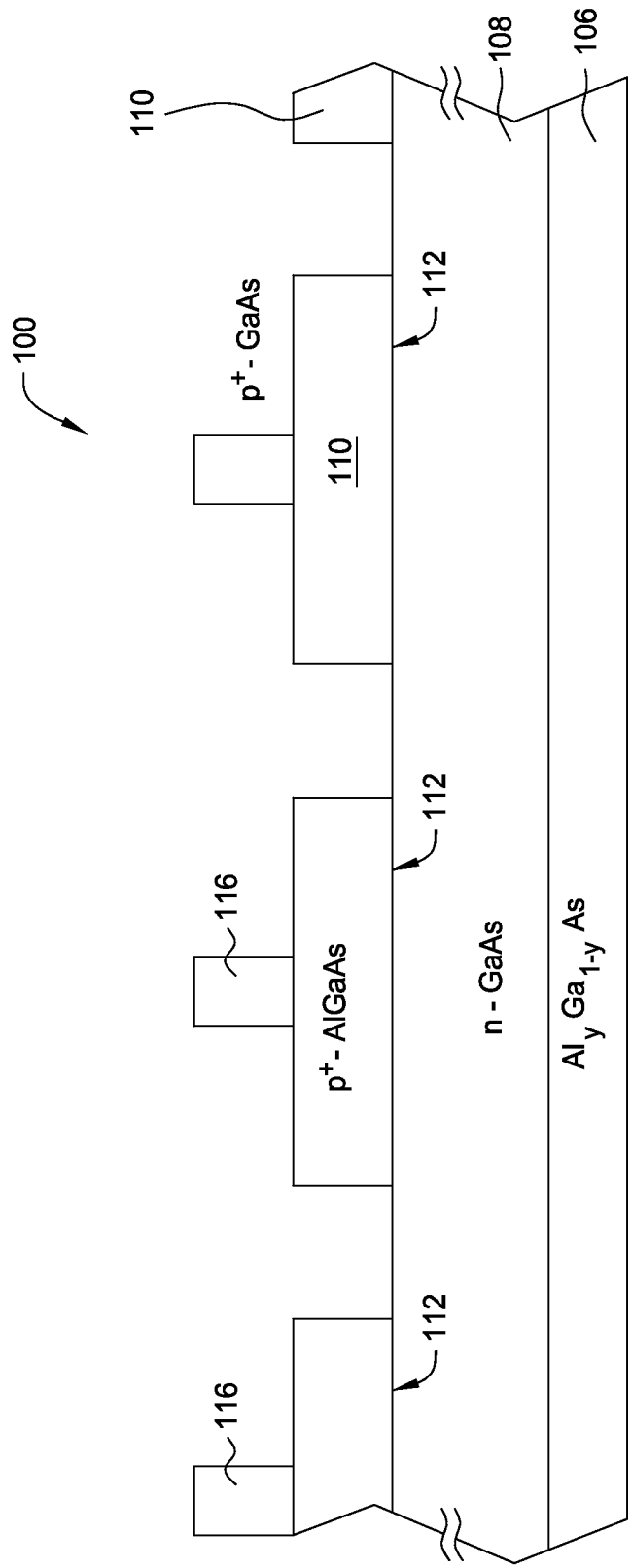
FIG. 1 illustrates multiple epitaxial layers for a photovoltaic (PV) unit in cross-section, in accordance with an embodiment of the present invention.

FIG. 1 illustrates various epitaxial layers of a photovoltaic (PV) unit 100 in cross-section. The various layers may be formed using any suitable method for semiconductor growth, such as molecular beam epitaxy (MBE) or metalorganic chemical vapor deposition (MOCVD), on a substrate (not shown).

The PV unit 100 may comprise a window layer 106 formed above the substrate and any underlying buffer layer(s). The window layer 106 may comprise aluminum gallium arsenide (AlGaAs), such as $Al_{0.3}Ga_{0.7}As$. The window layer 106 may be undoped. The window layer 106 may be transparent to allow photons to pass through the window layer on the front side of the PV unit to other underlying layers.

A base layer 108 may be formed above the window layer 106. The base layer 108 may comprise any suitable group III-V compound semiconductor, such as GaAs. The base layer 108 may be monocrystalline and may be n-doped.

As illustrated in FIG. 1, an emitter layer 110 may be formed above the base layer 108. The emitter layer 110 may comprise any suitable group III-V compound semiconductor for forming a heterojunction with the base layer 108. For example, if the base layer 108 comprises GaAs, the emitter layer 110 may comprise a different semiconductor material, such as AlGaAs (e.g., $Al_{0.3}Ga_{0.7}As$). If the emitter layer 110 and the window layer 106 both comprise AlGaAs, the $Al_xGa_{1-x}As$ composition of the emitter layer 110 may be the same as or different than the $Al_yGa_{1-y}As$ composition of the window layer. The emitter layer 110 may be monocrystalline and may be heavily p-doped (i.e., $p^+$-doped). The combination of the base layer 108 and the emitter layer 110 may form an absorber layer for absorbing photons.

The contact of an n-doped base layer to a $p^+$-doped emitter layer creates a p-n layer 112. When light is absorbed near the p-n layer 112 to produce electron-hole pairs, the built-in electric field may force the holes to the $p^+$-doped side and the electrons to the n-doped side. This displacement of free charges results in a voltage difference between the two layers 108, 110 such that electron current may flow when a load is connected across terminals coupled to these layers.

Rather than an n-doped base layer 108 and a $p^+$-doped emitter layer 110 as described above, conventional photovoltaic semiconductor devices typically have a p-doped base layer and an $n^+$-doped emitter layer. The base layer is typically p-doped in conventional devices due to the diffusion length of the carriers.

Once the emitter layer 110 has been formed, cavities or recesses 114 may be formed in the emitter layer deep enough to reach the underlying base layer 108. Such recesses 114 may be formed by applying a mask to the emitter layer 110 using photolithography, for example, and removing the semiconductor material in the emitter layer 110 not covered by the mask using any suitable technique, such as wet or dry etching. In this manner, the base layer 108 may be accessed via the back side of the PV unit 100.

For some embodiments, an interface layer 116 may be formed above the emitter layer 110. The interface layer 116 may comprise any suitable group III-V compound semiconductor, such as GaAs. The interface layer 116 may be $p^+$-doped.

Once the epitaxial layers have been formed, the functional layers of the PV unit 100 (e.g., the window layer 106, the base layer 108, and the emitter layer 110) may be separated from the buffer layer(s) 102 and substrate during an epitaxial lift-off (ELO) process.

Exemplary Light Trapping

To achieve efficiency, the absorber layer of an ideal photovoltaic (PV) device would absorb all of the photons impinging on the PV device's front side facing the light source since the open circuit voltage ($V_{oc}$) or short circuit current ($I_{sc}$) is proportional to the light intensity. However, several loss mechanisms typically interfere with the PV device's absorber layer seeing or absorbing all of the light reaching the front side of the device. For example, the semiconductor layers of the PV device may be shiny (especially when made of pure silicon) and, therefore, may reflect a substantial portion of the impinging photons, preventing these photons from ever reaching the absorber layer. If two semiconductor layers (e.g., the window layer and the base layer) have a different index of refraction, some of the photons reaching the interface between these two layers may be reflected according to Snell's Law if their angle of incidence is too high, again preventing these photons from reaching the absorber layer. Furthermore, the absorber layer may not absorb all of the impinging photons; some photons may pass through the absorber layer without affecting any electron-hole pairs.

Accordingly, there is a need for techniques and apparatus to capture the light impinging on the front side of the PV device such that as many photons as possible may be absorbed by the absorber layer and converted into electric energy. In this manner, the PV device's efficiency may be increased.

Apparatus for trapping the light within the semiconductor layers of a PV device may be divided into two categories: front side light trapping and back side light trapping. By employing both types of light trapping in a PV device, the idea is that nearly all photons impinging on the PV device's front side may be captured and "bounce around" within the semiconductor layers until the photons are absorbed by the absorber layer and converted to electric energy.

Exemplary Front Side Light Trapping

Figure 2:
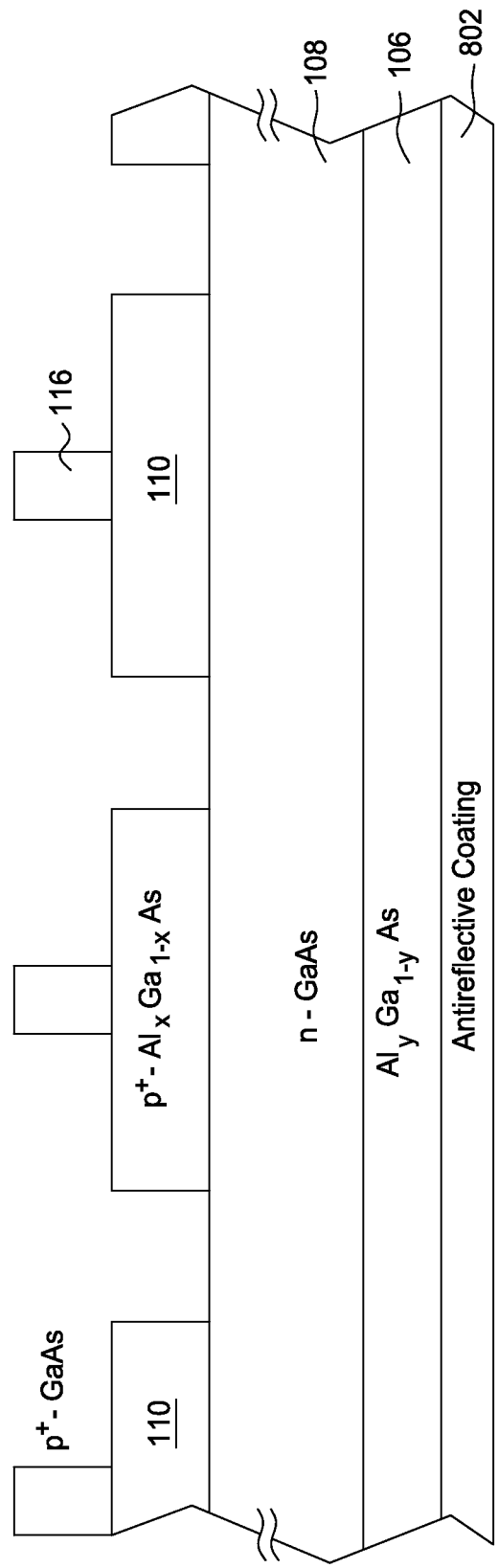
FIG. 2 illustrates an antireflective coating added to the semiconductor layers on the front side of the PV unit, in accordance with an embodiment of the present invention.

FIG. 2 illustrates an antireflective (AR) coating 802 disposed adjacent to the window layer 106 on the front side of the PV unit 100, in accordance with an embodiment of the present invention. According to its purpose, the AR coating 802 may comprise any suitable material that allows light to pass through while preventing light reflection from its surface. For example, the AR coating 802 may comprise magnesium fluoride ($MgF_2$), zinc sulfide (ZnS), silicon nitride (SiN), titanium dioxide ($TiO_2$), silicon dioxide ($SiO_2$), or any combination thereof. The AR coating 802 may be applied to the window layer 106 by any suitable technique, such as sputtering.

Figure 3:
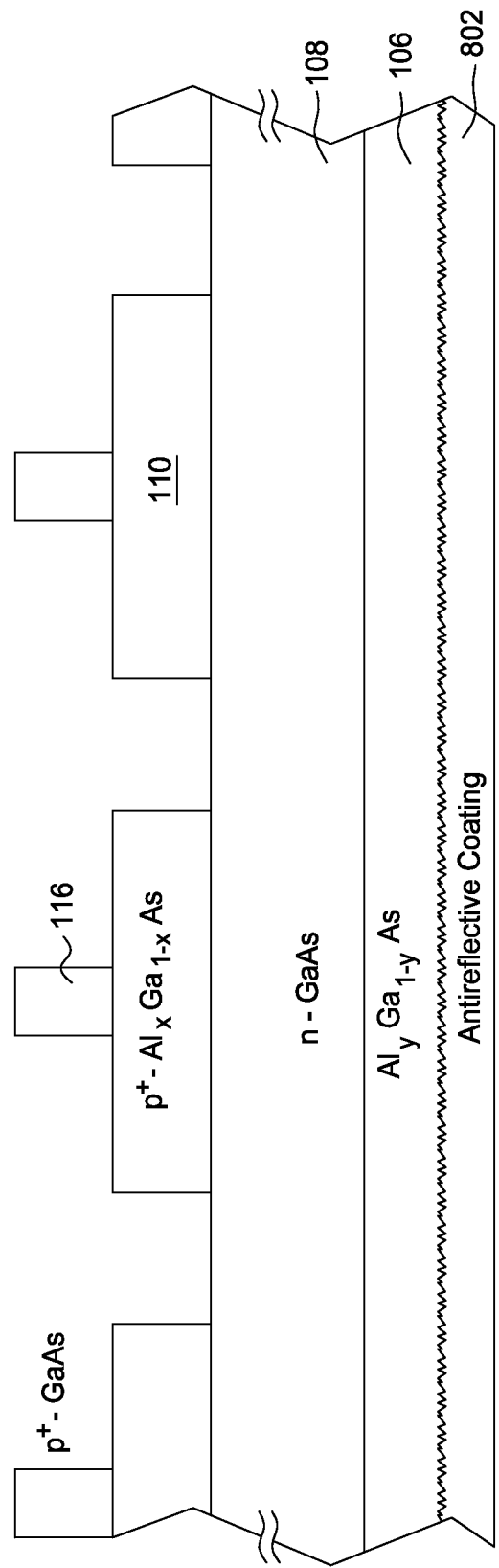
FIG. 3 illustrates roughening a window layer before applying the antireflective coating, in accordance with an embodiment of the present invention.

For some embodiments, the window layer 106 may be roughened or textured before applying the antireflective coating 802. FIG. 3 illustrates a roughened window layer 106. Roughening of the window layer 106 may be accomplished by wet etching or dry etching, for example. Texturing may be achieved by applying small particles, such as polystyrene spheres, to the surface of the window layer 106 before applying the AR coating 802. By roughening or texturing the window layer 106, different angles are provided at the interface between the AR coating 802 and the window layer, which may have different indices of refraction. In this manner, more of the incident photons may be transmitted into the window layer 106 rather than reflected from the interface between the AR coating 802 and the window layer because some photons' angles of incidence are too high according to Snell's Law. Thus, roughening or texturing the window layer 106 may provide increased light trapping.

Figure 4:
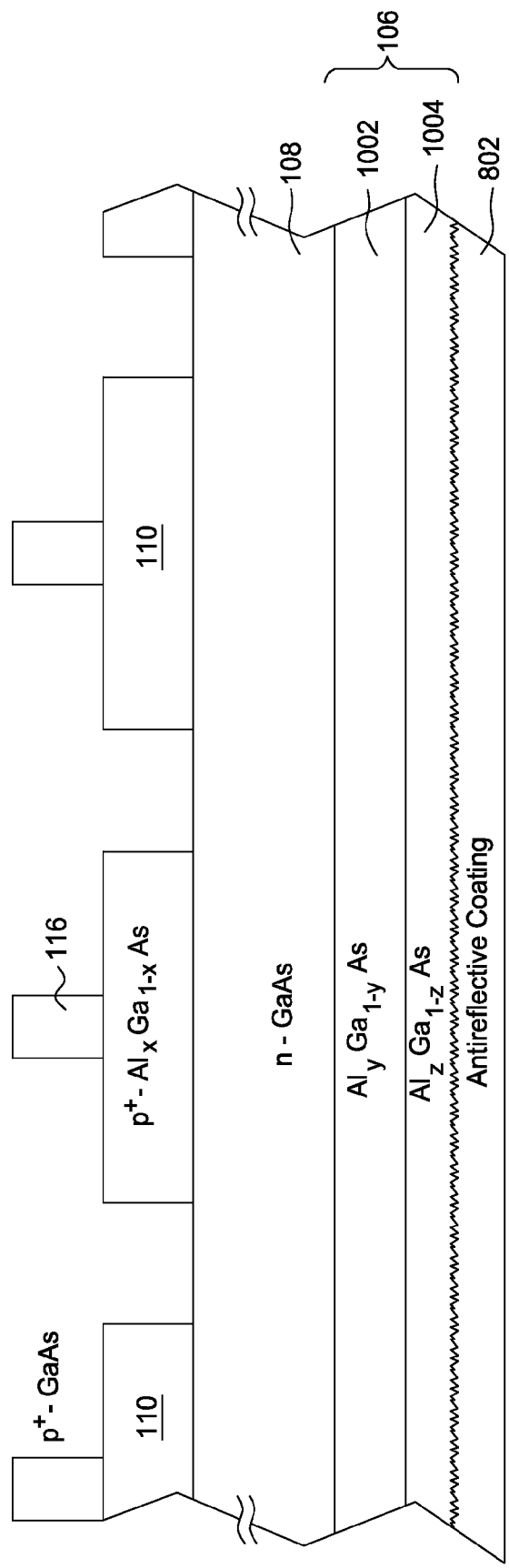
FIG. 4 illustrates multiple window layers, wherein the outermost window layer is roughened before the antireflective coating is applied, in accordance with an embodiment of the present invention.

Also for some embodiments, the window layer 106 may comprise multiple window layers. For these embodiments, the outermost window layer (i.e., the window layer closest to the front side of the PV unit 100) may be roughened or textured as described above before the antireflective coating 802 is applied, as illustrated in FIG. 4. In FIG. 4, the window layer 106 comprises a first window layer 1002 disposed adjacent to the base layer 108 and a second window layer 1004 interposed between the first window layer 1002 and the antireflective coating 802. The first and second window layers 1002, 1004 may comprise any material suitable for the window layer 106 as described above, such as AlGaAs, but typically with different compositions. For example, the first window layer 1002 may comprise $Al_{0.3}Ga_{0.7}As$, and the second window layer 1004 may comprise $Al_{0.1}Ga_{0.9}As$. Furthermore, some of the multiple window layers may be doped, while others are undoped for some embodiments. For example, the first window layer 1002 may be doped, and the second window layer 1004 may be undoped.

Exemplary Back Side Light Trapping

Figure 5:
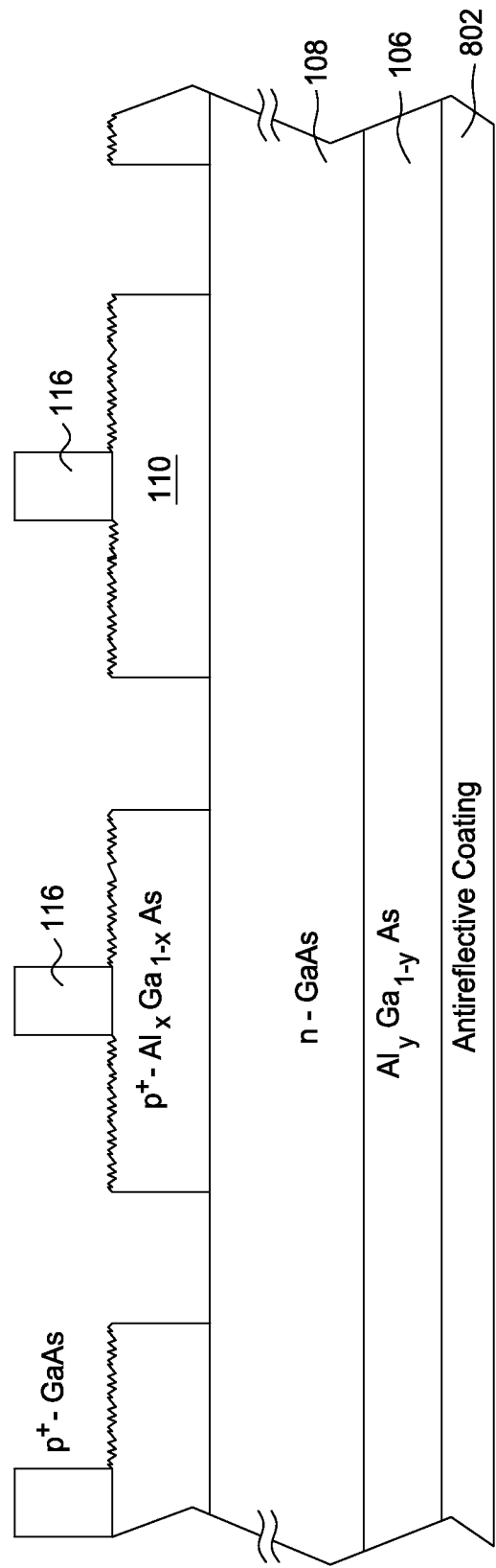
FIG. 5 illustrates a roughened emitter layer on the back side of the PV unit, in accordance with an embodiment of the present invention.

For some embodiments, the emitter layer 110 on the back side of the PV unit 100 may be roughened or textured, as described above with respect to the front side, in an effort to increase light trapping. FIG. 5 illustrates such a roughened emitter layer 110.

Figure 6:
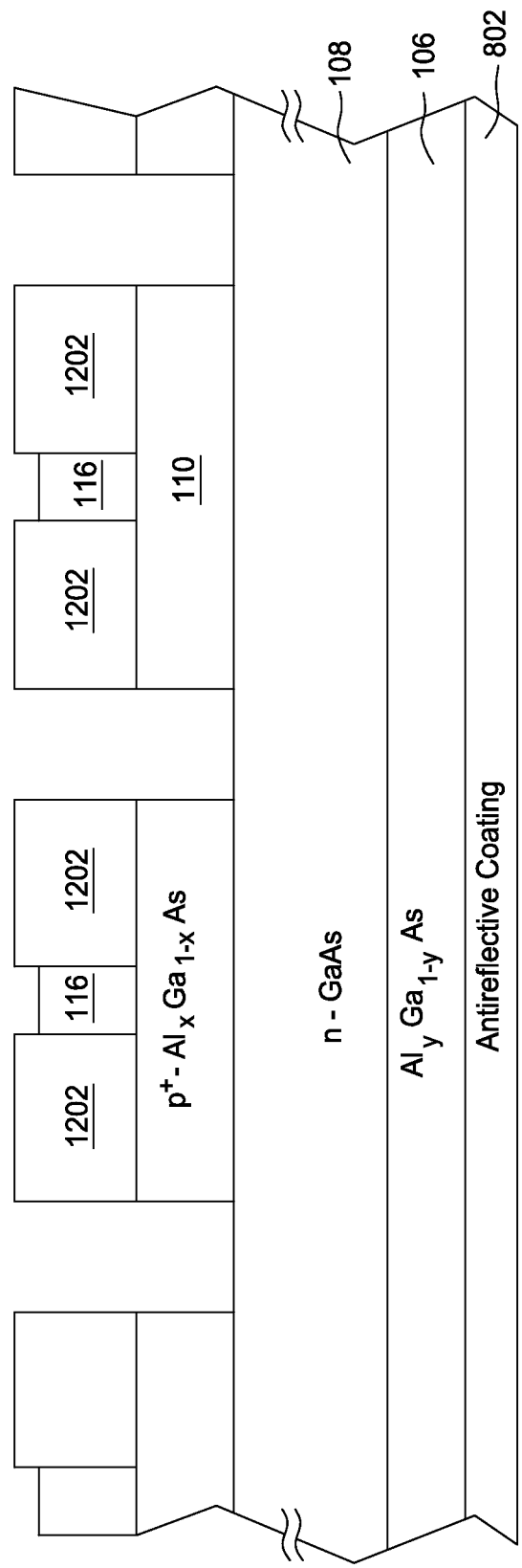
FIG. 6 illustrates a diffuser on the back side of the PV unit, in accordance with an embodiment of the present invention.

FIG. 6 illustrates a diffuser 1202 on the back side of the PV unit 100 in an effort to increase the amount of light captured by the absorber layer. Rather than reflecting photons similar to a mirror where the angle of reflectance equals the angle of incidence, the purpose of the diffuser 1202 is to diffuse or scatter photons that pass through the absorber layer without being absorbed. For some embodiments, the diffuser 1202 may be covered with a reflective layer 1204. In this manner, the diffuser 1202 may provide new angles to incident photons, some of which may be redirected back to the interior of the PV unit. For other photons that are directed to the back side of the PV unit, the reflective layer 1204 may redirect these photons back through the diffuser 1202 and towards the interior of the PV unit. Although some of the light may be absorbed by the diffuser 1202 as the photons are scattered and redirected inside, much of the light is redirected to the absorber layer to be absorbed and converted into electric energy, thereby increasing efficiency. Conventional PV devices without a diffuser and a reflective layer may not be able to recapture photons that reach the back side of the device without being absorbed initially by the absorber layer.

Figure 7:
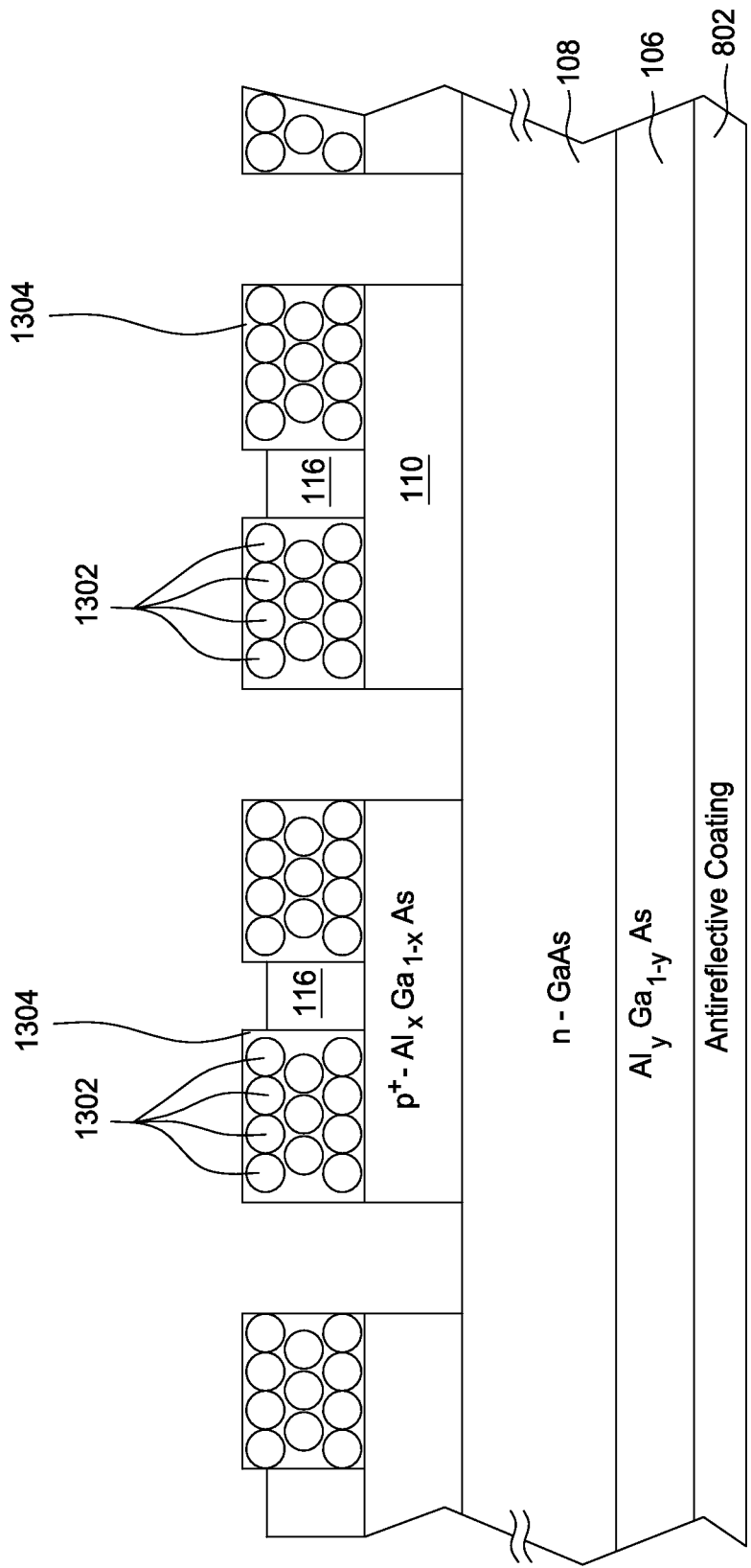
FIG. 7 illustrates dielectric particles and white paint functioning as the diffuser of FIG. 6, in accordance with an embodiment of the present invention.

For some embodiments, the diffuser 1202 may comprise dielectric particles 1302, as illustrated in FIG. 7. The dielectric particles may comprise any suitable material which is electrically insulative and does not absorb light. The dielectric particles 1302 may have a diameter in range from about 0.2 to 2.0 μm. The dielectric particles 1302 may be covered by white paint 1304, which reflects light and may act as the reflective layer for redirecting photons back to the interior of the PV unit 100. The white paint 1304 may comprise $TiO_2$, for example.

Figure 8:
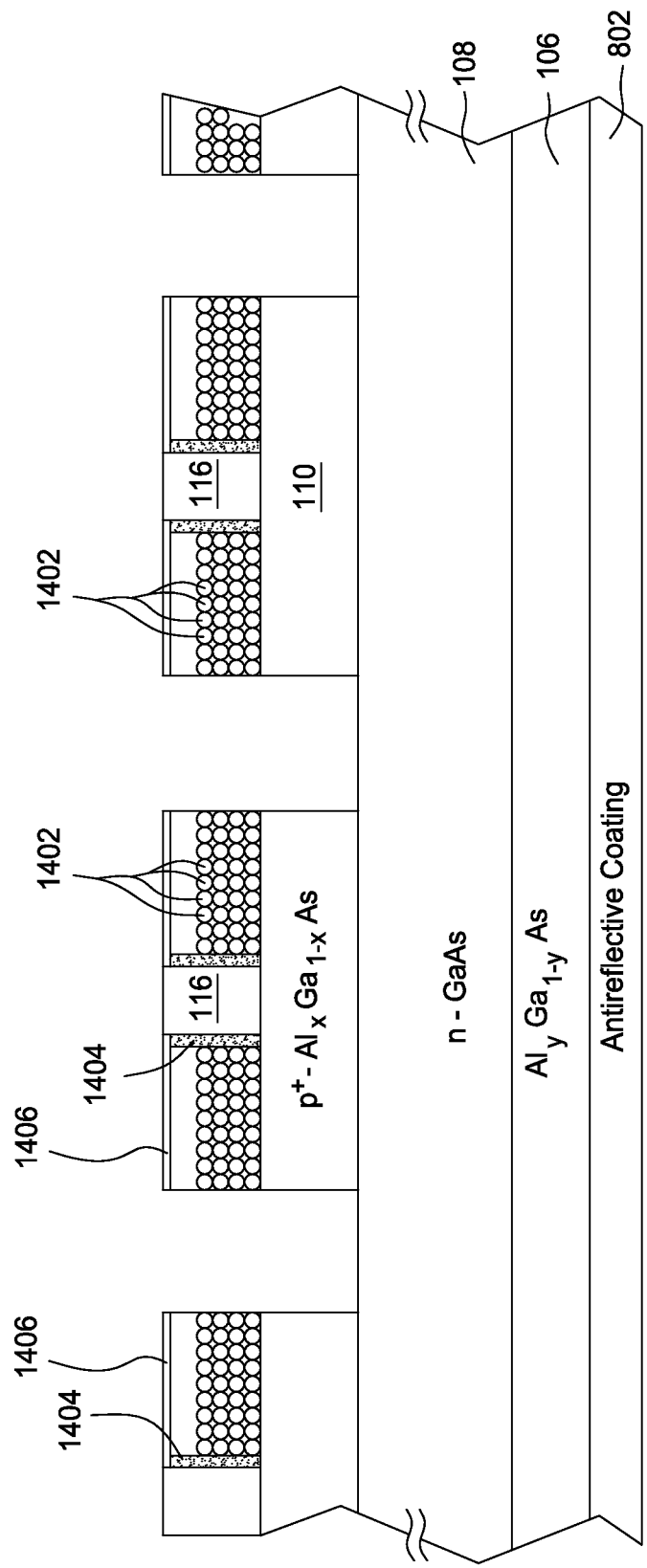
FIG. 8 illustrates metal particles functioning as the diffuser of FIG. 6, in accordance with an embodiment of the present invention.

For some embodiments, the diffuser 1202 may comprise metal particles 1402, as illustrated in FIG. 8. The metal particles 1402 may reflect photons that were not absorbed by the absorber layer, and by having a multitude of metal particles 1402, the photons may be scattered in different directions several times before being redirected to the interior of the PV unit 100. The metal particles 1402 may have a diameter of about 150 to 200 nm, functioning as relatively compact scatterers. With thinner particles in the diffuser 1202, the thickness of the PV unit 100 may be kept smaller, thereby maintaining the desired flexibility of the PV unit 100.

Because the metal particles 1402 are electrically conductive, lateral surfaces of the interface layer 116 may be passivated to prevent the metal particles 1402 from interfering with the operation of the device. The interface layer 116 may be passivated using any suitable passivation method, such as chemical vapor deposition (CVD) or plasma-enhanced CVD (PECVD). The passivation 1404 may comprise any suitable electrically non-conductive material, such as silicon nitride (SiN), $SiO_x$, $TiO_x$, $TaO_x$, zinc sulfide (ZnS), or any combination thereof. Furthermore, for some embodiments, a dielectric layer 1406 may be formed above the metal particles 1402 in an effort to avoid shunting any back side contacts, as depicted in FIG. 8. The dielectric layer 1406 may comprise any suitable electrically insulative material, such as $SiO_2$, SiN, or glass.

While the foregoing is directed to embodiments of the invention, other and further embodiments of the invention may be devised without departing from the basic scope thereof, and the scope thereof is determined by the claims that follow.

The invention claimed is:

1. A photovoltaic device, comprising:
   an interface layer comprising a Group III-V compound semiconductor;
   a $p^+$-doped layer below the interface layer, wherein recesses are formed in the $p^+$-doped layer, wherein a top surface of the $p^+$-doped layer is roughened to provide different angles for increased light trapping, and wherein a length in the horizontal direction of the $p^+$-doped layer is longer than a length in the horizontal direction of the interface layer;
   a n-doped layer below and in direct contact with the $p^+$-doped layer forming a p-n heterojunction;
   a window layer disposed below the n-doped layer, wherein the window layer is textured prior to applying an antireflective coating; and
   an antireflective coating disposed below the window layer.

2. The photovoltaic device of claim 1, wherein the n-doped layer comprises n-GaAs.

3. The photovoltaic device of claim 1, wherein the $p^+$-doped layer comprises $p^+$-AlGaAs.

4. The photovoltaic device of claim 3, wherein the $p^+$-doped layer comprises $p^+$-$Al_{0.3}Ga_{0.7}As$.

5. The photovoltaic device of claim 1, wherein the window layer comprises AlGaAs.

6. The photovoltaic device of claim 5, wherein the window layer comprises $Al_{0.3}Ga_{0.7}As$.

7. The photovoltaic device of claim 1, wherein the window layer has a thickness of about 20 nm.

8. The photovoltaic device of claim 1, wherein the antireflective coating comprises $MgF_2$, ZnS, SiN, $TiO_2$, $SiO_2$, or combinations thereof.

9. A photovoltaic device, comprising:
   an interface layer comprising a Group III-V compound semiconductor;
   a $p^+$-doped layer below the interface layer, wherein recesses are formed in the $p^+$-doped layer, wherein a top surface of the $p^+$-doped layer is roughened to provide different angles for increased light trapping, and wherein a length in the horizontal direction of the $p^+$-doped layer is longer than a length in the horizontal direction of the interface layer;
   a n-doped layer below and in direct contact with the $p^+$-doped layer forming a p-n heterojunction;
   a first window layer disposed below the n-doped layer;
   a second window layer below the first window layer; and
   an antireflective coating disposed below the second window layer, wherein a bottom surface of the second window layer directly adjacent to the antireflective coating is roughened to provide different angles for increased light trapping.

10. The photovoltaic device of claim 9, wherein the first window layer and the second window layer comprise AlGaAs, but with different compositions.

11. The photovoltaic device of claim 9, wherein the first window layer is doped and the second window layer is undoped.

* * * * *